(12) United States Patent
Lee

(10) Patent No.: US 6,489,882 B2
(45) Date of Patent: Dec. 3, 2002

(54) THIN-FILM RESISTOR

(75) Inventor: Jia-Sheng Lee, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/800,575

(22) Filed: Mar. 8, 2001

(65) Prior Publication Data

US 2002/0125987 A1 Sep. 12, 2002

(51) Int. Cl.[7] .............................................. H01C 1/012
(52) U.S. Cl. ........................ 338/309; 338/307; 338/308
(58) Field of Search ................................ 338/307, 308, 338/309; 257/536, 537, 904

(56) References Cited

U.S. PATENT DOCUMENTS

| | | | | |
|---|---|---|---|---|
| 3,717,514 A | * | 2/1973 | Burgess | 257/536 |
| 3,997,551 A | * | 12/1976 | Minagawa et al. | 257/536 |
| 4,862,197 A | * | 8/1989 | Stoffel | 347/59 |
| 4,975,386 A | * | 12/1990 | Rao | 257/536 |
| 5,083,183 A | * | 1/1992 | Kobayahsi | 257/536 |
| 5,254,497 A | * | 10/1993 | Liu | 257/536 |
| 5,285,099 A | * | 2/1994 | Carruthers et al. | 257/529 |
| 5,525,831 A | * | 6/1996 | Ohkawa et al. | 257/543 |
| 5,852,311 A | * | 12/1998 | Kwon et al. | 257/537 |
| 6,194,775 B1 | * | 2/2001 | Usami | 257/536 |

* cited by examiner

*Primary Examiner*—Karl D. Easthom
(74) *Attorney, Agent, or Firm*—Winston Hsu

(57) ABSTRACT

A resistance layer, a buffering layer and a protective layer are formed in a predetermined area of a dielectric layer. An insulating layer is formed on the semiconductor wafer to cover the upper and side surfaces of the protective layer, the side surfaces of the buffering layer and the resistance layer, and the surface of the dielectric layer outside of the predetermined area. Two openings extending down to the protective layer are formed by performing a dry-etching process on the insulating layer. Two openings extending down to the buffering layer are formed by performing a first wet-etching process on the protective layer below the two openings of the insulating layer. Two openings extending down to the resistance layer are formed by performing a second wet-etching process on the buffering layer below the two openings of the protective layer. Two conductive layers, which serve as two electrical terminals for connecting the two ends of resistance layer, are formed in the two openings to contact the two ends of the resistance layer.

5 Claims, 6 Drawing Sheets

THIN-FILM RESISTOR

BACKGROUND OF THE INVENTION

1. Field of the Invention

The present invention relates to a resistor device, and more particularly, to a thin-film resistor fabricated on a semiconductor wafer displaying superior performance and higher stability.

2. Description of the Prior Art

In semiconductor integrated circuit designs, a simple resistor is often made from a gate conductive layer or an impurity-doped layer in a predetermined area of the semiconductor wafer. However, the resistance typically obtained from the gate conductive layer and the impurity-doped layer is often insufficient. One approach to increase the resistance is to design a larger surface area of the resistor. However, it is undesirable to make this resistor device having a large surface area in a highly-integrated ULSI product. Furthermore, the resistance of the silicon-containing gate conductive layer and impurity doped layer varies with temperature changes, which results in instability of the resistance values. Therefore, there is a need for fabricating a stable thin-film resistor with lower conductivity on a semiconductor wafer.

Please refer to FIG. 1 and FIG. 2. FIG. 1 and FIG. 2 are cross-sectional diagrams schematically showing a method of forming a resistor 20 on a dielectric layer 12 according to the prior art. As shown in FIG. 1, a resistor 20 is produced by first sequentially forming a resistance layer 14 and a protective layer 16 on the surface of the dielectric layer 12. The resistance layer 14 and the protective layer 16 are defined by conventional photolithographic and etching processes. A conductive layer 18, made of an aluminum alloy, is then formed on the protective layer 16. As shown in FIG. 2, a large portion of the conductive layer 18 and the protective layer 16 positioned on the resistance layer 14 is removed by a wet-etching process. The remaining portion at the two ends of the resistance layer 14 functions as two electrical terminals for the two ends of the resistance layer 14.

The wet-etching process is an isotropic etching process with equal horizontal and vertical etching depths. To define the conductive layer 18 properly through wet etching, the surface area of the resistance layer 14 and the protective layer 16 must be large. Only if the resistance layer 14 and protective layer 16 is large can a large portion of the conductive layer 18 and protective layer 16 be removed while still preserving the two portions at the ends of the resistance layer 14. Although this method can be utilized in processing gate widths greater than 3 micrometers, it is ineffective in processing narrower gate widths.

SUMMARY OF THE INVENTION

It is therefore a primary objective of the present invention to provide an improved thin-film resistor with much more stable resistance and a smaller required surface area.

In accordance with the objective of the present invention, the present invention provides a thin-film resistor on a dielectric layer of a semiconductor wafer. The thin-film resistor has a dielectric layer deposited on the semiconductor wafer. A patterned resistance layer is formed on the dielectric layer. A buffering layer is formed on the resistance layer, the buffering layer comprising two openings above two opposite ends of the resistance layer. A protective layer is positioned on the buffering layer and comprises two openings above the two openings of the buffering layer. An insulating layer covers the upper and side surfaces of the protective layer, the side surface of the buffering layer and the resistance layer, and the dielectric layer. The insulating layer has two openings above the two openings of the protective layer. Two conductive layers are positioned in the two openings of the buffering layer, the protective layer and the insulating layer, and are in contact with the two ends of resistance layer. The conductive layers are used as two electric terminals for electrically connecting to the two ends of the resistance layer.

It is an advantage of the present invention that the thin-film resistor thus formed comprises a resistance layer below a buffering layer and a protective layer. The buffering layer buffers the thermal stress exerted on the resistance layer, and the protective layer protects the resistance layer from plasma damage. The resulting thin-film resistor has a much more stable resistance.

This and other objectives of the present invention will no doubt become obvious to those of ordinary skill in the art after having read the following detailed description of the preferred embodiment, which is illustrated in the various figures and drawings.

DETAILED DESCRIPTION OF THE PREFERRED EMBODIMENT

Figure 1:
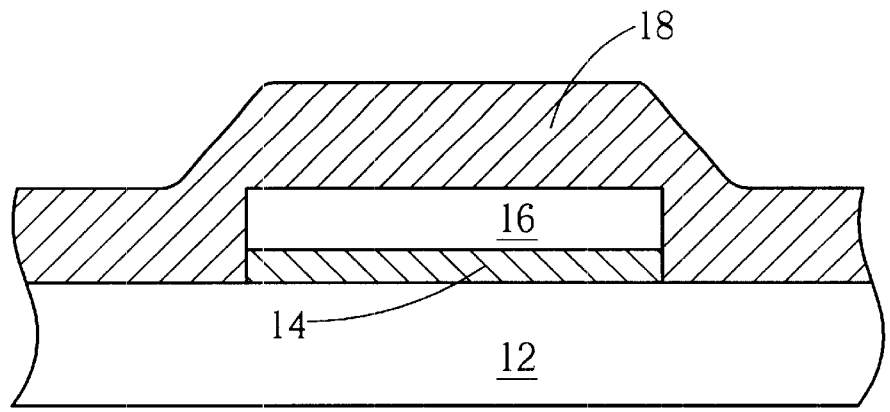
FIG. 1 and FIG. 2 are cross-sectional diagrams schematically showing a method of forming a resistor on a dielectric layer 12 according to the prior art.
Figure 2:
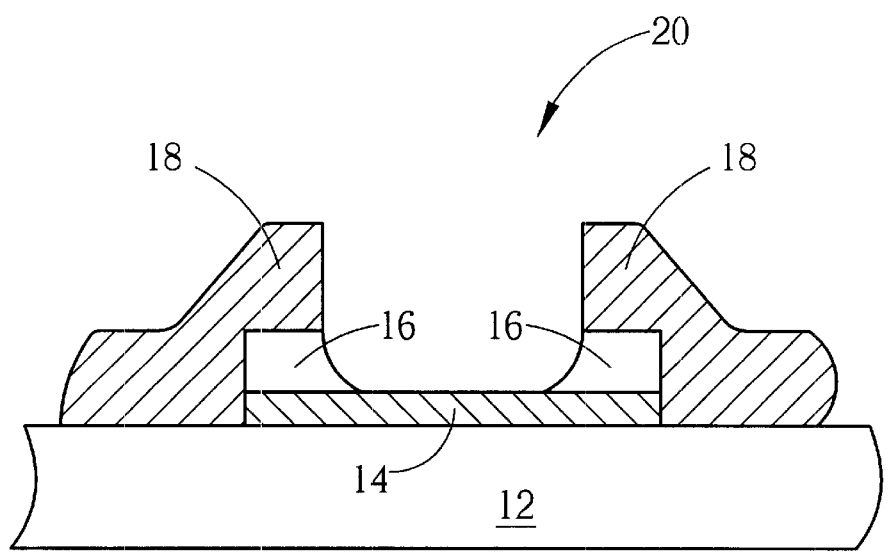
Figure 3:
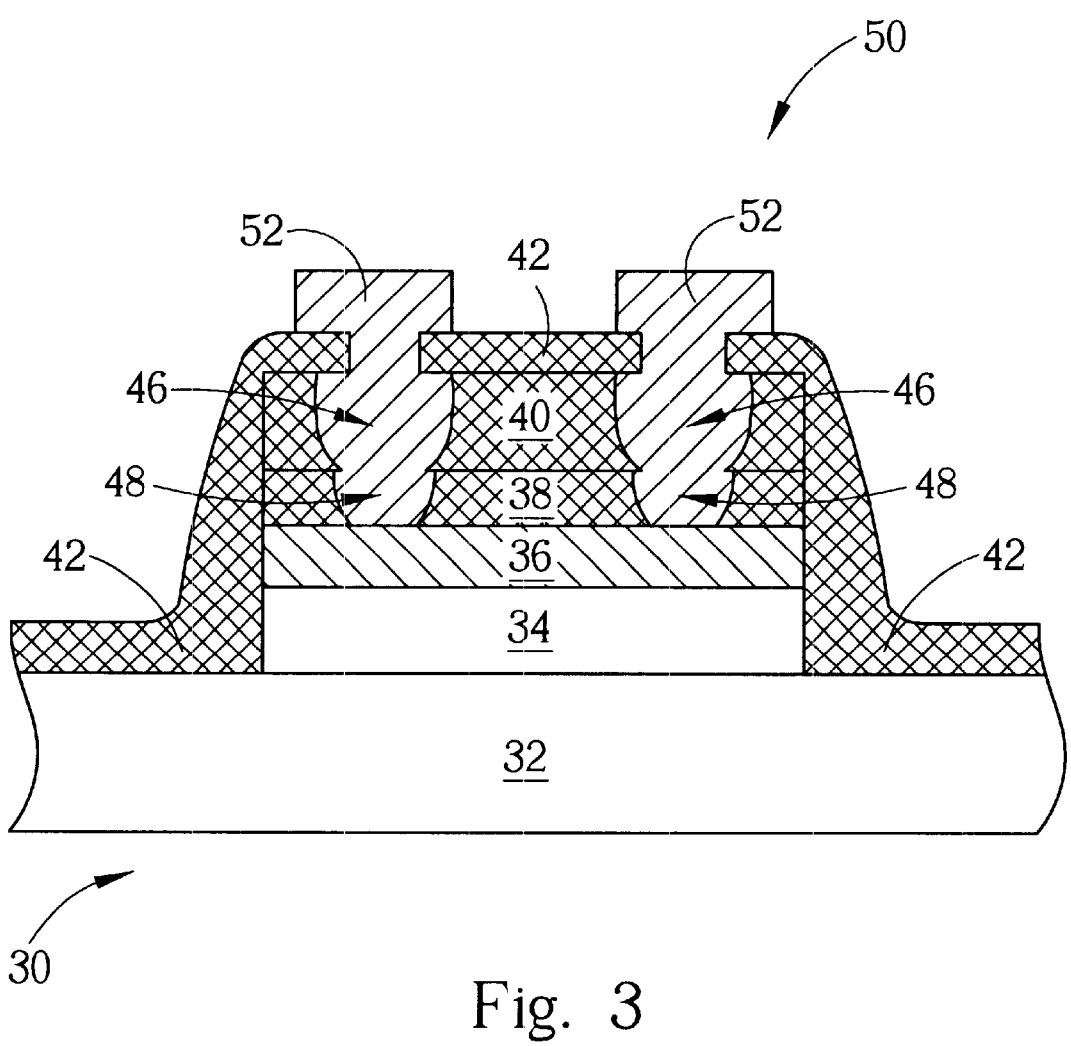
FIG. 3 is a cross-sectional diagram illustrating a thin-film resistor structure according to the present invention.

Please refer to FIG. 3. FIG. 3 is a sectional schematic diagram of a thin-film resistor 50 according to the present invention. The thin-film resistor 50 is formed on a semiconductor wafer 30 and comprises a dielectric layer 32, an isolating layer 34, a resistance layer 36, a buffering layer 38, a protective layer 40, an insulating layer 42, and two conductive layers 52. The dielectric layer 32 is positioned on the semiconductor wafer 30. The isolating layer 34 is positioned in a predetermined area of the dielectric layer 32. The resistance layer 36 is positioned on the isolating layer 34 within the predetermined area. The buffering layer 38 is positioned on the resistance layer 36 within the predetermined area and comprises two openings 48 above two opposite ends of the resistance layer 36. The protective layer 40 is positioned on the buffering layer 38 within the predetermined area and comprises two openings 46 above the two openings 48 of the buffering layer 38. The insulating layer 42 is formed on the semiconductor wafer 30 and covers the upper and side surface of the protective layer 40, the side surfaces of the buffering layer 38 and the resistance layer 36, and the surface of the dielectric layer 32 outside of the predetermined area. The two conductive layers 52 are separately positioned in the two openings 46 and 48 of the buffering layer 38, the protective layer 40 and insulating layer 42, and electrically connect to the two ends of resistance layer 36. Thus, the two conductive layers 52 are used as two electric terminals for the two ends of the resistance layer 36.

Figure 4:
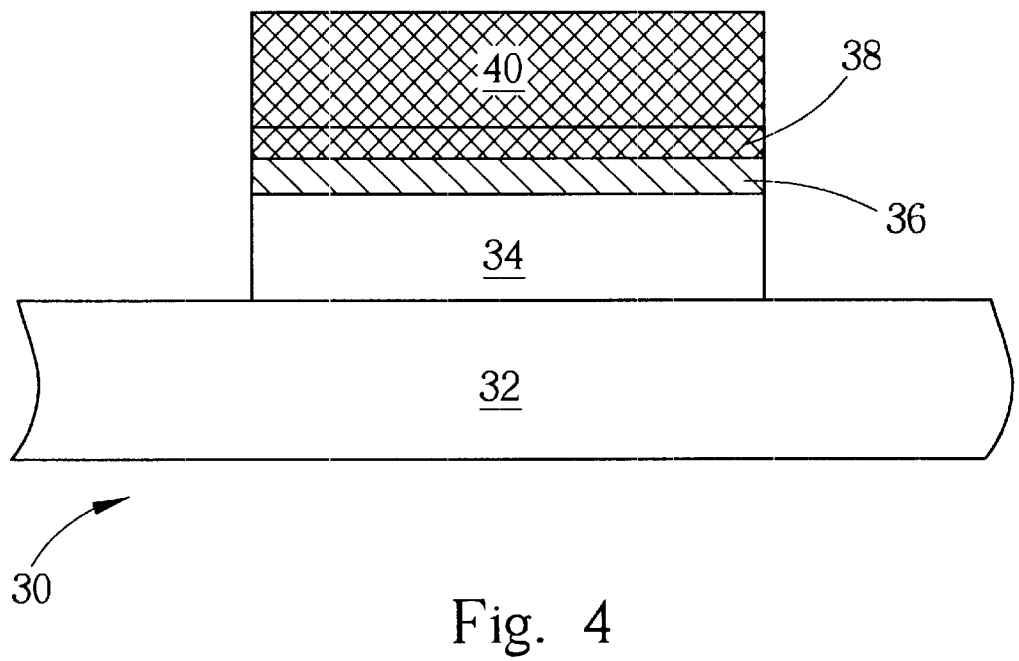
FIG. 4 to FIG. 8 are schematic diagrams of a method of forming the thin-film resistor as shown in FIG. 3.
Figure 5:
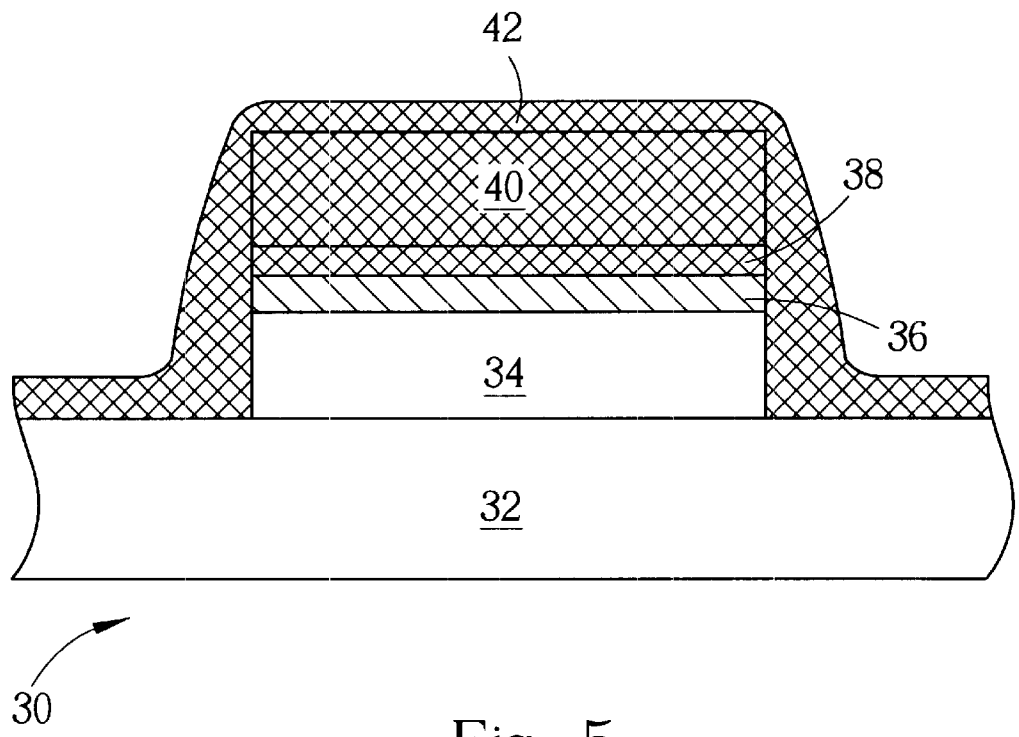

Please refer to FIG. 4 to FIG. 8. FIG. 4 to FIG. 8 are schematic diagrams of a method of forming the thin-film resistor 50 as shown in FIG. 3. The thin-film resistor 50 is formed on the dielectric layer 32 positioned on the surface of the semiconductor wafer 30. The dielectric layer 32 is formed of borophosphosilicate glass (BPSG). In forming the thin-film resistor 50, the isolating layer 34 is made from silicon nitride (SiN) or silicon oxide, and is first formed on the dielectric layer 32. The resistance layer 36, made from SiCr (chromium silicon), is then formed on the isolating layer 34. Next, the buffering layer 38, made from silicon oxide, and the protective layer 40, made from silicon nitride, are formed on the resistance layer 36 in order by way of a chemical vapor deposition (CVD) process. Later, the protective layer 40, the buffering layer 38, the resistance layer 36 and the isolating layer 34 outside the predetermined area are removed by performing an anisotropic dry-etching process, as shown in FIG. 4. Afterwards, the insulating layer 42, made from silicon oxide, is formed on the semiconductor wafer 30 by a CVD method, as shown in FIG. 5. The insulating layer 42 covers the upper and side surfaces of the protective layer 40, the side surfaces of the buffering layer 38, the resistance layer 36 and the isolating layer 34, and the surface of the dielectric layer 32 outside of the predetermined area.

Figure 6:
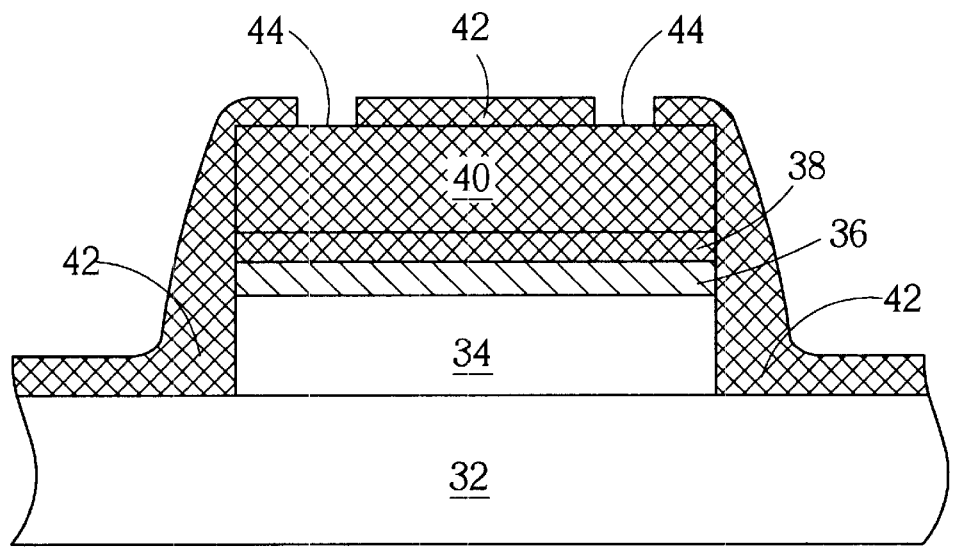
Figure 7:
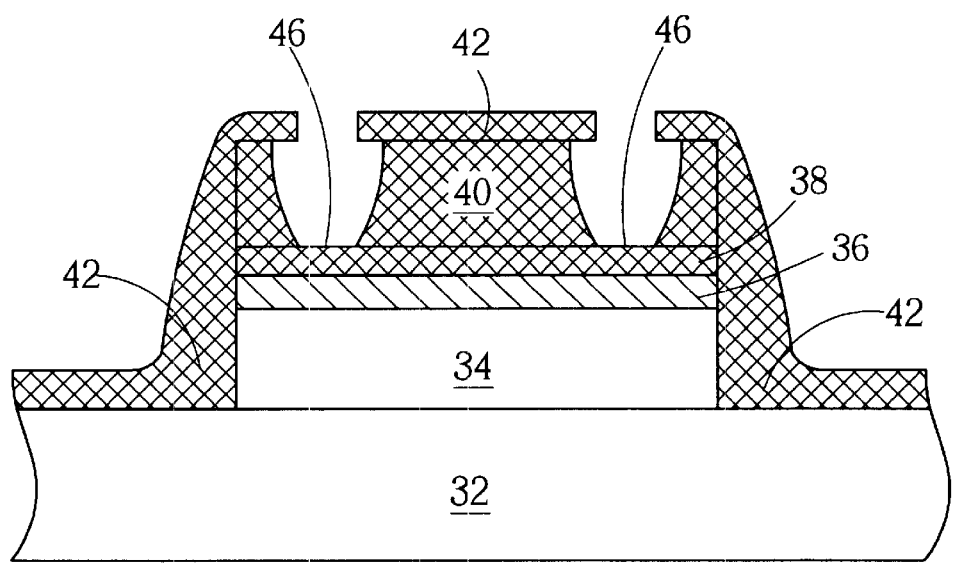
Figure 8:
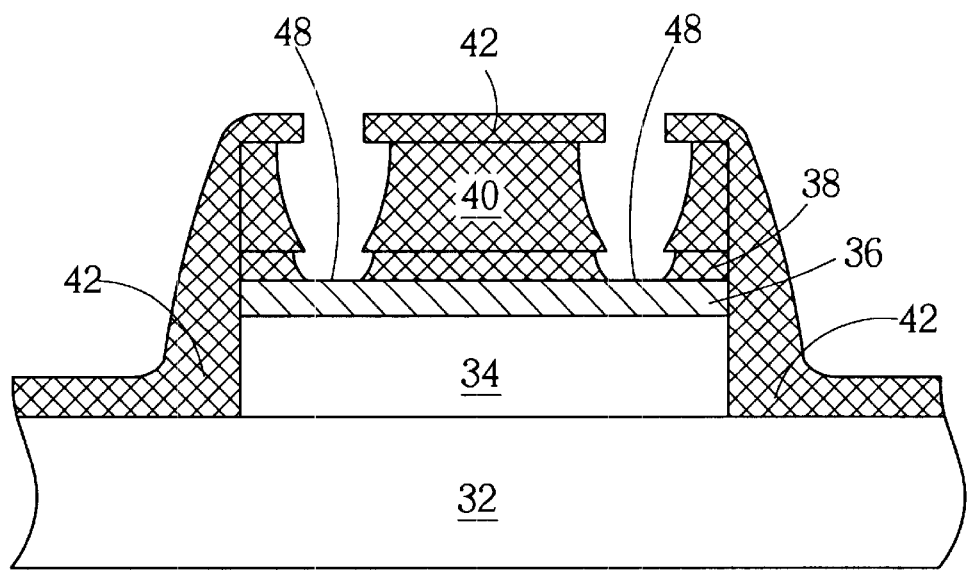

Next, two openings 44, extending down to the protective layer 40, are formed in the insulating layer 42 by performing a dry-etching process, as shown in FIG. 6. Then, two openings 46, extending down to the buffering layer 38, are formed in the protective layer 40 by performing a first wet-etching process, as shown in FIG. 7. The first wet-etching process employs phosphoric acid ($H_3PO_4$) as the etching solution. Next, two openings 48, extending down to the resistance layer 36, are formed in the buffering layer 38 below the two openings 46 of the protective layer 40 by performing a second wet-etching process, as shown in FIG. 8. The second wet-etching process employs a buffered oxide etcher (BOE) as the etching solution. Finally, the two conductive layers 52 are separately formed in the two openings that are formed of the three openings 44, 46 and 48 of the insulating layer 42, the protective layer 40, and the buffering layer 38. The conductive layers 52 electrically connect to the two ends of the resistance layer 36, as shown in FIG. 3. The two conductive layers 52 function as electrical terminals for the two ends of the resistance layer 36. The isolating layer 34 is employed to isolate out-gassing produced from the borophosphosilicate glass of the dielectric 32 so that the out-gassing does not affect the resistance of the thin-film resistor 50. The buffering layer 38 is used to buffer the effects of thermal stress exerted on the resistance layer 36 by the protective layer 40. The protective layer 40 is used to protect the resistance layer 36 from plasma damage caused by the dry-etching process. Therefore, the resistance of the thin-film resistor 50 is very stable. Also, in the formation of two electrically connected channels above the two ends of the resistance layer 36, the two openings 44 in the insulating layer 42 are formed by a dry etching process prior to the formation of the two openings 46 and 48 through wet etching that extend down to the buffering layer 38 and the resistance layer 36. Hence, the two conductive layers 52 formed in the two channels do not occupy too large of a surface area on the thin-film resistor 50. Also, the method of forming the thin-film resistor 50 can be utilized in narrower gate processes for reducing the overall area of the semiconductor product.

Figure 9:
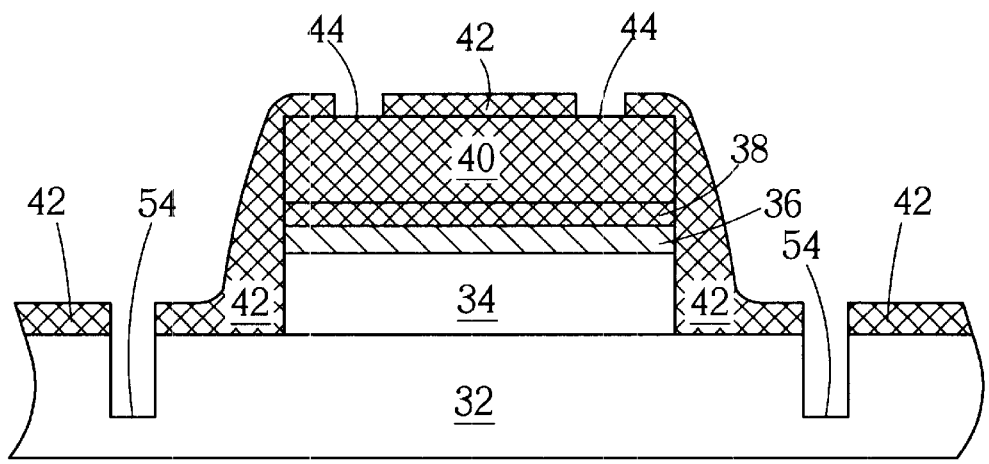
FIG. 9 to FIG. 11 are schematic diagrams of an alternative embodiment according to the present invention.
Figure 10:
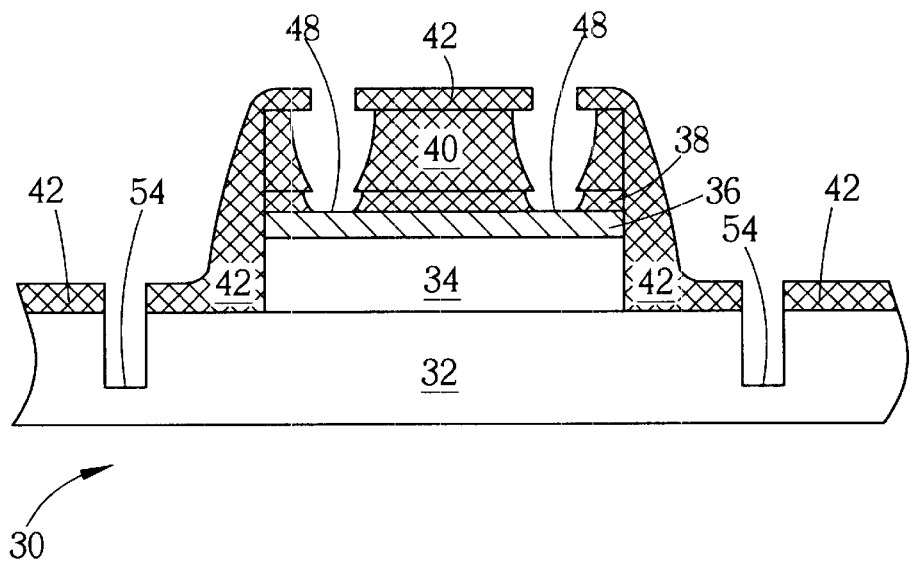
Figure 11:
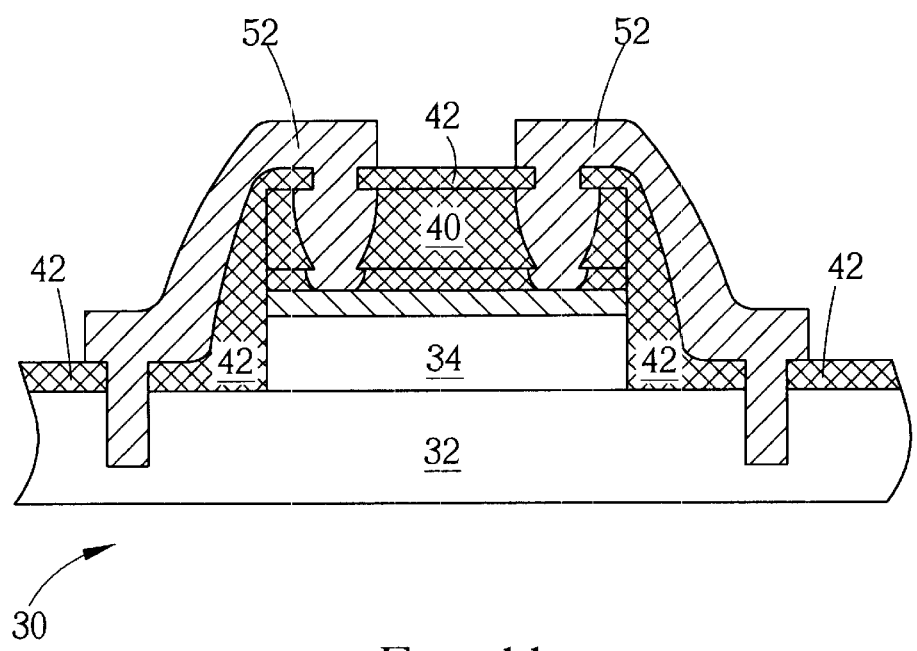

Please refer to FIG. 9 to FIG. 11. FIG. 9 to FIG. 11 are schematic diagrams of an alternative embodiment according to the present invention. During the formation of the thin-film resistor 50, a contact hole can also be formed on the semiconductor wafer 30 outside the predetermined area for electrically connecting the devices within the semiconductor wafer 30. While forming the two openings 44 on the insulating layer 42 through dry-etching in the previously described process of forming the thin-film resistor 50, two contact holes 54 can also be formed on the dielectric layer 32 and the insulating layer 42 outside of the predetermined area, as shown in FIG. 9. Next, the two openings 46 and 48 that extend down to the resistance layer 36 are formed by performing the first wet-etching process and the second wet-etching process in sequence, as shown in FIG. 10. Finally, two third conductive layers 52 are formed in the two contact holes 54 and in the two openings 54, extending to the-resistance layer 36. The conductive layers 52 in the two contact holes 54 separately connect one of the two electrical terminals on the two ends of the resistance layer 36 across the surface of the insulating layer 42.

Compared to the prior art of the thin-film resistor 20, in the method of forming the thin-film resistor 50 of the present invention, the two openings extending down to the resistance layer 36 are formed by performing a dry-etching process on the insulating layer 42 first and then performing a wet-etching process twice: one on the protective layer 40 and the other on the buffering layer 38. Next, the two conductive layers 52 are separately formed in the two openings to serve as the two electrical terminals of the two ends of the resistance layer 36. The buffering layer 38 buffers the effects of thermal stress exerted on the resistance layer 36 by the protective layer 40. The protective layer 40 protects the resistance layer 36 from plasma damage caused by the dry-etching process. Therefore, the resistance of the thin-film resistor 50 is very stable. Also, the method is suitable for use in processing narrow gates.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A thin-film resistor formed on a semiconductor wafer, the thin-film resistor comprising:
   a dielectric layer deposited on the semiconductor wafer;
   an isolating layer formed in a predetermined area on the dielectric layer;
   a patterned resistance layer formed on the isolating layer;
   a buffering layer formed on the resistance layer, the buffering layer comprising two openings above two opposite ends of the resistance layer;
   a protective layer positioned on the buffering layer and comprising two openings above the two openings of the buffering layer;
   an insulating layer formed on the semiconductor wafer and covering the upper and side surfaces of the protective layer, the side surfaces of the buffering layer, the resistance layer, the isolating layer, and the surface of the dielectric layer, the insulating layer comprising two openings above the two openings of the protective layer; and
   two conductive layers positioned in the two openings of the buffering layer, the protective layer, and the insulating layer, the two conductive layers in contact with the two respective ends of the resistance layer, the two conductive layers being used as two electric terminals for connecting the two ends of the resistance layer;

wherein the buffering layer is used to alleviate thermal stress exerted on the resistance layer from the protective layer, the protective layer is used to protect the resistance layer from plasma damage caused by a dry-etching process when forming the two openings of the insulating layer, and the isolating layer is used to isolate out-gassing produced by the dielectric layer so that the out-gassing does not affect the resistance of the thin-film resistor.

2. The thin-film resistor of claim 1 wherein the resistance is formed of chromium silicon.

3. The thin-film resistor of claim 1 wherein the buffering layer is formed of silicon oxide, the protective layer is formed of silicon nitride, the insulating layer is formed of silicon oxide, and the dielectric layer is formed of borophosphosilicate glass (BPSG).

4. The thin-film resistor of claim 3 wherein the isolating layer being used to isolate out-gassing produced by the borophosphosilicate glass of the dielectric layer.

5. The thin-film resistor of claim 4 wherein the isolating layer is formed of silicon nitride or silicon oxide.

* * * * *